US009310924B2

(12) United States Patent
Hanssen et al.

(10) Patent No.: US 9,310,924 B2
(45) Date of Patent: Apr. 12, 2016

(54) INCREASING THE DYNAMIC RANGE OF AN INTEGRATOR BASED MUTUAL-CAPACITANCE MEASUREMENT CIRCUIT (71) Applicants: Ingar Hanssen, Tiller (NO); Rian Whelan, Drogheda (IE)

(72) Inventors: Ingar Hanssen, Tiller (NO); Rian Whelan, Drogheda (IE)

(73) Assignee: Atmel Corporation, San Jose, CA (US)

( * ) Notice: Subject to any disclaimer, the term of this patent is extended or adjusted under 35 U.S.C. 154(b) by 246 days.

(21) Appl. No.: 13/627,028

(22) Filed: Sep. 26, 2012

(65) Prior Publication Data

US 2014/0085252 A1    Mar. 27, 2014

(51) Int. Cl.
| | |
|---|---|
| *G06F 3/045* | (2006.01) |
| *G06F 3/038* | (2013.01) |
| *G01R 27/26* | (2006.01) |
| *G06F 3/041* | (2006.01) |
| *G06F 3/044* | (2006.01) |
| *H03K 17/96* | (2006.01) |

(52) U.S. Cl.
CPC .......... *G06F 3/0416* (2013.01); *G01R 27/2605* (2013.01); *G06F 3/044* (2013.01); *H03K 17/9622* (2013.01); *G06F 3/038* (2013.01); *H03K 2217/960725* (2013.01); *H03K 2217/960745* (2013.01)

(58) Field of Classification Search
None
See application file for complete search history.

(56) References Cited

U.S. PATENT DOCUMENTS

| | | | |
|---|---|---|---|
| 6,493,404 B1 * | 12/2002 | Iizuka et al. | .................. 375/343 |
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |

(Continued)

FOREIGN PATENT DOCUMENTS

WO    WO 2012/129247    9/2012

OTHER PUBLICATIONS

U.S. Appl. No. 61/454,936, filed Mar. 21, 2011, Myers.

(Continued)

*Primary Examiner* — Srilakshmi K Kumar
*Assistant Examiner* — Stephen T Reed
(74) *Attorney, Agent, or Firm* — Baker Botts L.L.P.

(57) ABSTRACT

In one embodiment, a method includes deactivating an integrator of a mutual-capacitive measurement circuit and configuring the mutual-capacitive measurement circuit according to a first voltage configuration. The first voltage configuration results in a charge on a sensor capacitor and a compensation capacitor when a supply voltage is applied to the mutual-capacitive measurement circuit. The method also includes adjusting a variable reference voltage input of the integrator to a first reference voltage, wherein the first reference voltage is selected to increase an output range of the mutual-capacitive measurement circuit. The method also includes applying the supply voltage to the mutual-capacitive measurement circuit and obtaining a first reference measurement from an analog-digital-converter coupled to an output of the mutual-capacitance measurement circuit.

20 Claims, 7 Drawing Sheets

(56) References Cited

U.S. PATENT DOCUMENTS

| | | |
|---|---|---|
| 8,031,174 B2 | 10/2011 | Hamblin |
| 8,040,326 B2 | 10/2011 | Hotelling |
| 8,049,732 B2 | 11/2011 | Hotelling |
| 8,179,381 B2 | 5/2012 | Frey |
| 2009/0315854 A1 | 12/2009 | Matsuo |
| 2010/0097345 A1* | 4/2010 | Jang et al. .................... 345/174 |
| 2010/0110040 A1* | 5/2010 | Kim et al. .................... 345/174 |
| 2010/0328252 A1* | 12/2010 | Chang et al. ................. 345/174 |
| 2011/0025629 A1* | 2/2011 | Grivna et al. ................. 345/173 |
| 2012/0217978 A1* | 8/2012 | Shen et al. .................... 324/601 |
| 2012/0218020 A1* | 8/2012 | Erdogan et al. ............... 327/337 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2012/0287077 A1* | 11/2012 | Pant et al. .................... 345/174 |
| 2014/0021966 A1* | 1/2014 | Shahrokhi et al. ............ 324/679 |
| 2014/0071082 A1* | 3/2014 | Singh et al. .................. 345/174 |

OTHER PUBLICATIONS

U.S. Appl. No. 61/454,950, filed Mar. 21, 2011, Lynch.
U.S. Appl. No. 61/454,894, filed Mar. 21, 2011, Rothkopf.

* cited by examiner

INCREASING THE DYNAMIC RANGE OF AN INTEGRATOR BASED MUTUAL-CAPACITANCE MEASUREMENT CIRCUIT

TECHNICAL FIELD

This disclosure generally relates to touch sensitive technology.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
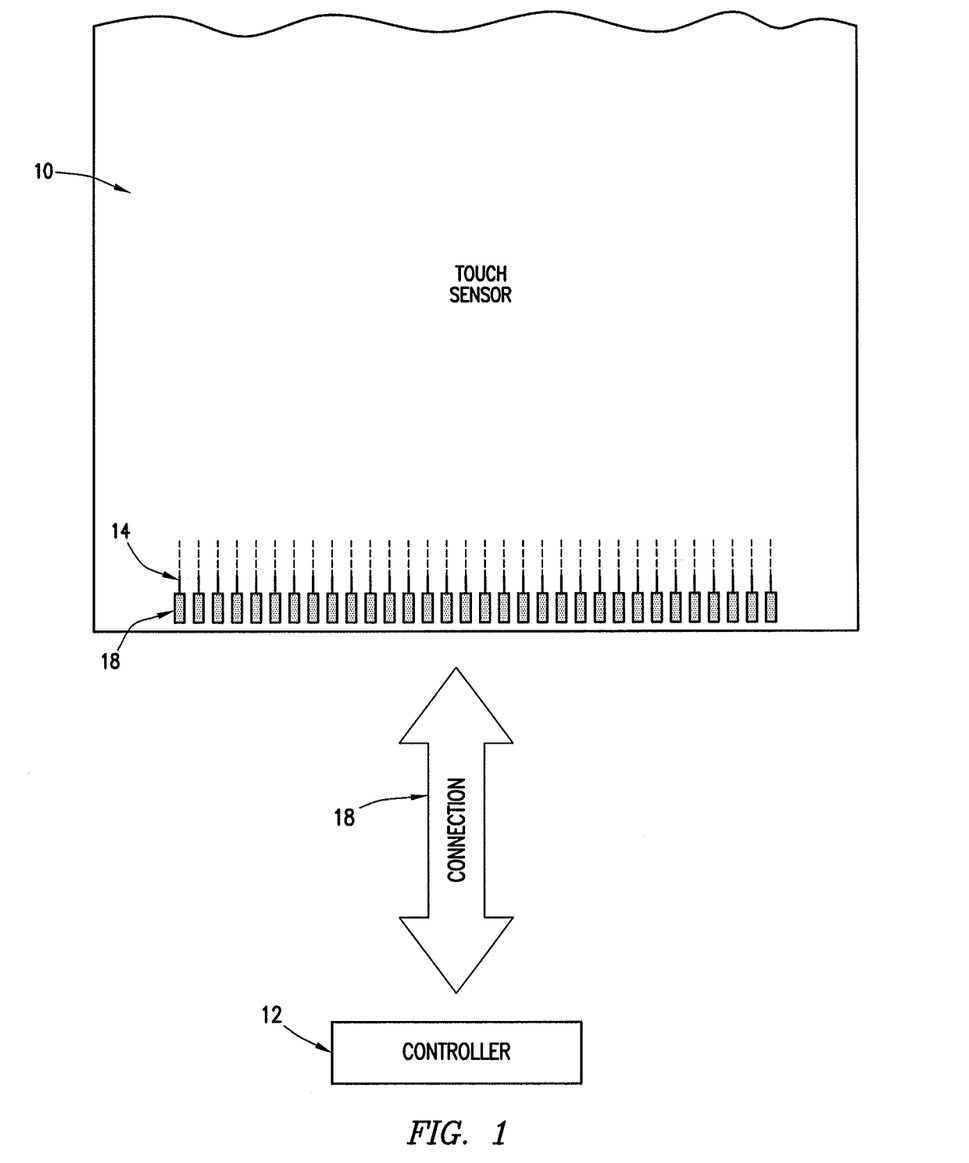
FIG. 1 illustrates an example touch sensor and controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate)

(PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2:
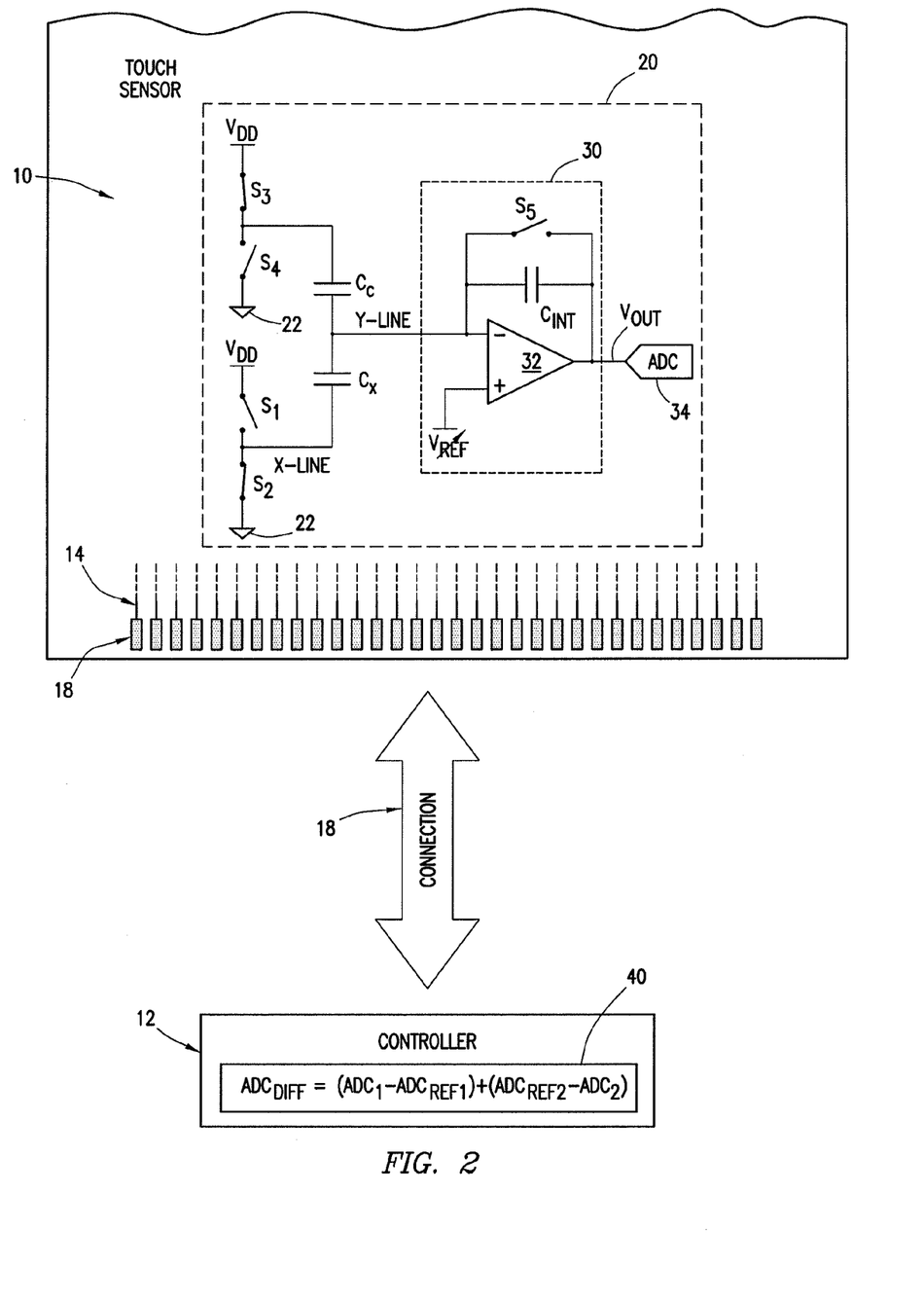
FIG. 2 illustrates an example schematic of a mutual-capacitance measurement circuit embodied in a touch sensor.

FIG. 2 illustrates an example schematic of a mutual-capacitance measurement circuit 20 for determining a change in capacitance of a sensor capacitor $C_X$. For example, mutual-capacitance measurement circuit 20 may be utilized by a touch sensor 10 and touch-sensor controller 12 to detect the presence and location of a touch or the proximity of an object within a touch-sensitive area. Touch sensor 10 and/or touch-sensor controller 12 may detect a touch or the proximity of an object within the touch-sensitive area by measuring the change in capacitance of sensor capacitors associated with one or more mutual-capacitance measurement circuits 20 embodied in touch sensor 10. Touch sensor 10 and touch-sensor controller 12 from FIG. 2 may be similar to touch sensor 10 and touch-sensor controller 12 from FIG. 1.

Mutual-capacitance measurement circuit 20 of FIG. 2 includes a sensor capacitor $C_X$ and a compensation capacitor $C_C$. Sensor capacitor $C_X$ may be an external sensing capacitor and compensation capacitor $C_C$ may be a digitally tunable capacitor. Sensor capacitor $C_X$ may be coupled to a voltage source $V_{DD}$ and ground 22 through switches $S_1$ and $S_2$, respectively. Similarly, compensation capacitor $C_C$ may be coupled to a voltage source $V_{DD}$ and ground 22 through switches $S_3$ and $S_4$, respectively. The midpoint M between sensor capacitor $C_X$ and compensation capacitor $C_C$ may be coupled to integrator circuit 30. The output of mutual-capacitance measurement circuit 20 may be coupled to analog-to-digital converter (ADC) 34 for converting the output voltage $V_{OUT}$ into a corresponding digital value. In particular embodiments, integrator circuit 30 may include op-amp 32, switch $S_5$, and integration capacitor $C_{INT}$. In such embodiments, integration circuit 30 may include a feedback loop coupling the output of op-amp 32 to the inverting input (−) of op-amp 32, and integration capacitor $C_{INT}$ and switch $S_5$ may reside on the feedback loop. The non-inverting input (+) of op-amp 32 may be coupled to a dynamically adjustable variable reference voltage $V_{REF}$. Variable reference voltage $V_{REF}$ may be capable of dynamic adjustment to increase the dynamic range of mutual-capacitance measurement circuit 20 when measuring changes in capacitance. Increasing the dynamic range of mutual-capacitance measurement circuit 20 may help prevent and/or avoid saturation of the circuit 20, resulting in improved sensitivity when using mutual-capacitance measurement circuit 20 to detect touch or proximity events. Mutual-capacitance measurement circuit 20 may be used to detect a touch or the proximity of an object relative to sensor capacitor $C_X$ by measuring the change in capacitance of sensor capacitor $C_X$. For example, the output voltage $V_{OUT}$ of mutual-capacitance measurement circuit 20 may represent the relative change in capacitance of sensor capacitor $C_X$ at any given time. Touch-sensor controller 12 may continuously measure and process the output from mutual-capacitance measurement circuit 20. The touch-sensor controller may determine that a touch or proximity event has occurred when it detects a change in capacitance of sensor capacitor $C_X$. The touch-sensor controller may determine the proximity of the object that caused the change of capacitance based on the magnitude of the change in capacitance.

In particular embodiments, the change in capacitance of sensor capacitor $C_X$ may be determined using differential measurements to minimize common-mode noise. A differential measurement cycle may involve obtaining two measurements of the change in capacitance of sensor capacitor $C_X$. The first half of a differential measurement cycle may involve measuring the change in capacitance of sensor capacitor $C_X$ at a first polarity and the second half of the differential measurement cycle may involve measuring the change in capacitance of sensor capacitor $C_X$ with the polarity reversed. A differential measurement of the change in capacitance of sensor capacitor $C_X$ may be calculated, for example, using the following equation 40:

$$ADC_{DIFF}=(ADC_1-ADC_{REF1})+(ADC_{REF2}-ADC_2)$$

In this equation, $ADC_{REF1}$ and $ADC_1$ may be digital values obtained from ADC 34 during the first half of the differential measurement cycle, and $ADC_{REF2}$ and $ADC_2$ may be digital values obtained from ADC 34 during the second half of the differential measurement cycle when the polarity is reversed. $ADC_{REF1}$ and $ADC_{REF2}$ may be reference measurements from the respective halves of the differential measurement cycle that represent the output voltage $V_{OUT}$ when mutual-capacitance measurement circuit 20 is balanced. $ADC_1$ and $ADC_2$ may be measurements from the respective halves of the differential measurement cycle that represent the output voltage $V_{OUT}$ when the capacitance of sensor capacitor $C_X$ has been altered by a touch or proximity event. Accordingly, the change in capacitance of sensor capacitor $C_X$ during the first half of the differential measurement cycle may be computed as the difference between $ADC_1$ and $ADC_{REF1}$, and the change in capacitance of sensor capacitor $C_X$ during the second half of the differential measurement cycle may be computed as the difference between $ADC_{REF2}$ and $ADC_2$.

When a touch sensor is initially powered on, a touch-sensor controller may continuously cycle through various phases in order to obtain the necessary measurements required for calculating a differential measurement according to equation 40 above. The first and second phases may involve obtaining the requisite ADC measurements during the first half of the differential measurement cycle (i.e., $ADC_{REF1}$ and $ADC_1$) and the third and fourth phases may involve obtaining the requisite ADC measurements during the second half of the differential measurement cycle (i.e., $ADC_{REF2}$ and $ADC_2$). For example, the first phase may involve obtaining the first ADC reference measurement (i.e., $ADC_{REF1}$ from equation 40) by measuring the output of ADC 34 during the first half of the differential measurement cycle while mutual-capacitance measurement circuit 20 is configured in emitter-follower mode. The second phase may involve obtaining the first ADC measurement (i.e., $ADC_1$ from equation 40) by measuring the output of ADC 34 during the first half of the differential measurement cycle while mutual-capacitance measurement circuit 20 is configured in integration mode. The third phase may involve obtaining the second ADC reference measurement (i.e., $ADC_{REF2}$ from equation 40) by measuring the output of ADC 34 during the second half of the differential measurement cycle while mutual-capacitance measurement circuit 20 is configured in emitter-follower mode. The fourth phase may involve obtaining the second ADC measurement (i.e., $ADC_2$ from equation 40) by measuring the output of ADC 34 during the second half of the differential measurement cycle while mutual-capacitance measurement circuit 20 is configured in integration mode. After completing these phases, a differential measurement may be calculated according to equation 40. For subsequent differential measurements, the ADC reference measurements obtained during the first and third phases may be re-used. Thus, subsequent differential measurements may be calculated by repeating the second and fourth phases without having to repeat the first and third phases. This is because the first and third phases may be calibration phases that only need to be performed when a touch sensor is initially powered on, or upon determining that mutual-capacitance measurement circuit 20 needs to be re-calibrated. A touch-sensor controller may continuously calculate differential measurements in this manner in order to detect touch and proximity events.

A more detailed discussion of the first, second, third, and fourth phases of a differential measurement calculation may be found below in the description of FIGS. 3A, 4A, 5A, and 6A, respectively.

Figure 3A:
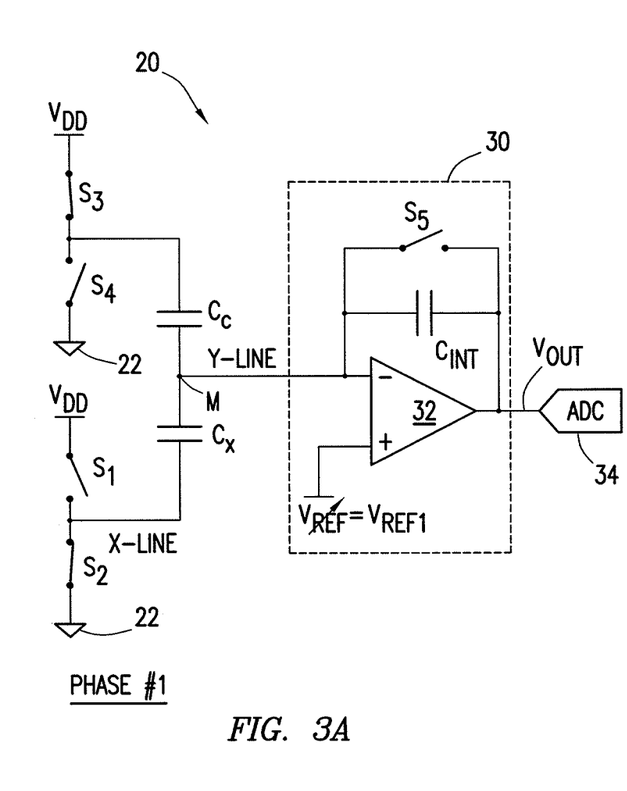
FIG. 3A illustrates an example schematic of a mutual-capacitance measurement circuit configured for the first phase of a differential measurement calculation.

FIG. 3A illustrates an example schematic of a mutual-capacitance measurement circuit 20 configured for the first phase of a differential measurement calculation. Mutual-capacitance measurement circuit 20 of FIG. 3A may be similar to mutual-capacitance measurement circuit 20 of FIG. 2 and may contain similar components. The first phase of a differential measurement calculation may involve obtaining an ADC reference measurement during the first half of a differential measurement cycle (i.e., $ADC_{REF1}$ from equation 40 of FIG. 2) while mutual-capacitance measurement circuit 20 is configured in emitter-follower mode.

As illustrated by FIG. 3A, in the first phase of a differential measurement calculation mutual-capacitance measurement circuit 20 may be configured such that the supply voltage $V_{DD}$, when applied, is driven from the top plate of compensation capacitor $C_C$ across sensor capacitor $C_X$. For example, mutual-capacitance measurement circuit 20 may be configured such that compensation capacitor $C_C$ may be coupled to voltage source $V_{DD}$ but not to ground 22 and sensor capacitor $C_X$ may be coupled to ground 22 but not to voltage source $V_{DD}$. In particular embodiments, compensation capacitor $C_C$ may be coupled to voltage source $V_{DD}$ and not ground 22 by closing switch $S_3$ and opening switch $S_4$ and sensor capacitor $C_X$ may be coupled to ground 22 but not to voltage source $V_{DD}$ by closing switch $S_2$ and opening switch $S_1$. Variable reference voltage $V_{REF}$ of op-amp 32 may be adjusted to a reference voltage $V_{REF1}$ for the first half of the differential measurement cycle to increase the dynamic range of mutual-capacitance measurement circuit 20. For example, in the first half of the differential measurement cycle, reference voltage $V_{REF1}$ may be less than half the voltage of voltage source $V_{DD}$ (i.e., less than $V_{DD}/2$), but far enough above zero to avoid low level noise. In this manner, the dynamic range of output voltage $V_{OUT}$ of mutual-capacitance measurement circuit 20 may range from $V_{REF1}$ to $V_{DD}$. Mutual-capacitance measurement circuit 20 may also be configured in emitter-follower mode, which, when voltage is supplied, causes output voltage $V_{OUT}$ to remain at a constant voltage equal to the non-inverting input (+) of op-amp 32. For example, mutual-capacitance measurement circuit 20 may be configured in emitter-follower mode by discharging integration capacitor $C_{INT}$. In particular embodiments, integration capacitor $C_{INT}$ may be discharged by closing switch $S_5$.

Figure 3B:
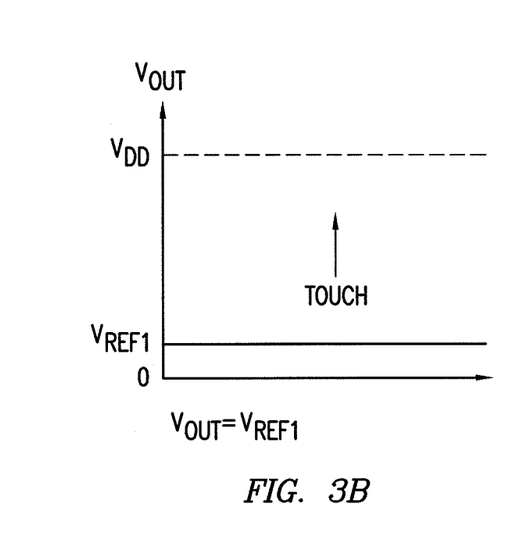
FIG. 3B illustrates a graph of an example output of the mutual-capacitance measurement circuit from FIG. 3A.

After mutual-capacitance measurement circuit 20 is configured for the first phase of the differential measurement calculation, voltage source $V_{DD}$ may be driven from the top plate of compensation capacitor $C_C$ across sensor capacitor $C_X$, resulting in a charge share between $C_C$ and $C_X$ and a voltage at the midpoint M between $C_C$ and $C_X$ that is proportional to the values of $C_C$ and $C_X$. Because mutual-capacitance measurement circuit 20 is configured in emitter-follower mode, output voltage $V_{OUT}$ may remain at a constant voltage equal to $V_{REF1}$, which is the voltage supplied at the non-inverting input (+) of op-amp 32. This is illustrated by the graph of FIG. 3B, which shows output voltage $V_{OUT}$ remaining constant at $V_{REF1}$. The first ADC reference measurement (i.e., $ADC_{REF1}$ from equation 40 of FIG. 2) may now be obtained from ADC 34, for example, by converting output voltage $V_{OUT}$ into a corresponding digital value.

After obtaining the first ADC reference measurement during the first half of the differential measurement cycle, the first phase of the differential measurement calculation may be complete. Mutual-capacitance measurement circuit 20 may then be configured for the second phase of the differential measurement calculation, as described, for example, with respect to FIG. 4A.

Figure 4A:
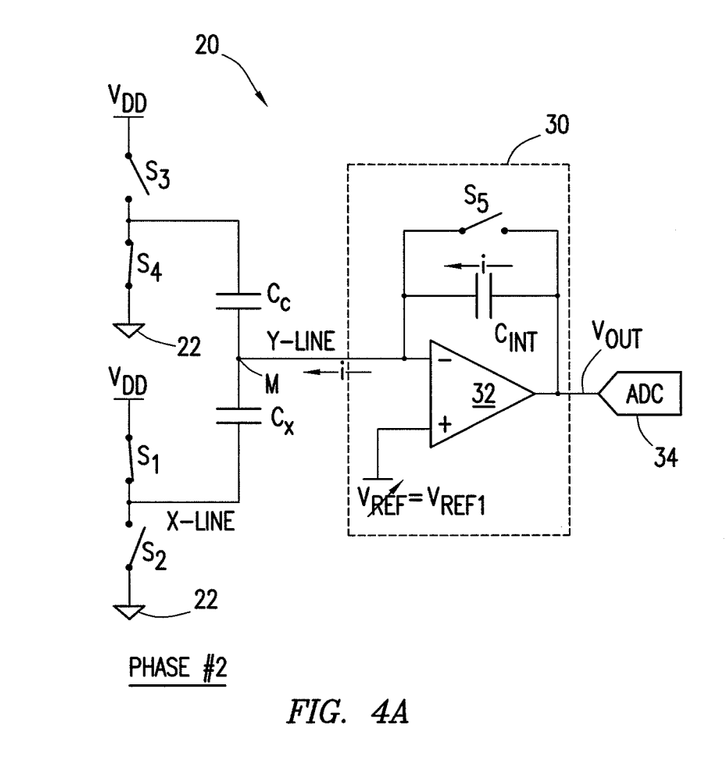
FIG. 4A illustrates an example schematic of a mutual-capacitance measurement circuit configured for the second phase of a differential measurement calculation.

FIG. 4A illustrates an example schematic of a mutual-capacitance measurement circuit 20 configured for the second phase of a differential measurement calculation. Mutual-capacitance measurement circuit 20 of FIG. 4A may be similar to mutual-capacitance measurement circuit 20 of FIG. 2 and may contain similar components. The second phase of a differential measurement calculation may involve calibrating a compensation capacitor $C_C$, if necessary, and obtaining an ADC measurement during the first half of a differential measurement cycle (i.e., $ADC_1$ from equation 40 of FIG. 2) while mutual-capacitance measurement circuit 20 is configured in integration mode.

As illustrated by FIG. 4A, in the second phase of a differential measurement calculation mutual-capacitance measurement circuit 20 may be configured such that the supply voltage $V_{DD}$, when applied, is driven from the lower plate of sensor capacitor $C_X$ across compensation capacitor $C_C$. For example, mutual-capacitance measurement circuit 20 may be configured such that compensation capacitor $C_C$ may be coupled to ground 22 but not to voltage source $V_{DD}$ and sensor capacitor $C_X$ may be coupled to voltage source $V_{DD}$ but not to ground 22. In particular embodiments, compensation capacitor $C_C$ may be coupled to ground 22 but not to voltage source $V_{DD}$ by closing switch $S_4$ and opening switch $S_3$ and sensor capacitor $C_X$ may be coupled to voltage source $V_{DD}$ but not to ground 22 by closing switch $S_1$ and opening switch $S_2$. Variable reference voltage $V_{REF}$ of op-amp 32 may also be adjusted to the same reference voltage $V_{REF1}$ that was used to increase the dynamic range of mutual-capacitance measurement circuit 20 during the first phase of the differential measurement calculation. In addition, compensation capacitor $C_C$ may be tuned to a previously calibrated value, if available. If compensation capacitor $C_C$ has not previously been calibrated for the second phase of the differential measurement calculation, then it may need to be calibrated as explained below. Mutual-capacitance measurement circuit 20 may then be configured in integration mode, which, when voltage is supplied, causes output voltage $V_{OUT}$ to respond to changes in the input voltage of integrator circuit 30 over time. Integration mode may be configured, for example, by opening switch $S_5$ to enable integration capacitor $C_{INT}$. If mutual-capacitance measurement circuit 20 was already configured in integration mode during the previous phase, integration capacitor $C_{INT}$ may need to be discharged, for example by closing switch $S_5$, to release any charge that may remain on integration capacitor $C_{INT}$. Integration mode may then be re-configured by opening switch $S_5$ to enable integration capacitor $C_{INT}$.

After mutual-capacitance measurement circuit 20 is configured for the second phase of the differential measurement calculation, voltage source $V_{DD}$ may be driven from the lower plate of sensor capacitor $C_X$ across compensation capacitor $C_C$, resulting in a charge share between $C_X$ and $C_C$ and a voltage at the midpoint M between $C_X$ and $C_C$ that is proportional to the values of $C_X$ and $C_C$. If compensation capacitor $C_C$ has not already been calibrated for the second phase, at this time compensation capacitor $C_C$ may be adjusted until mutual-capacitance measurement circuit 20 is balanced and the midpoint M between $C_C$ and $C_X$ is equal to reference voltage $V_{REF1}$. Once compensation capacitor $C_C$ has been calibrated, output voltage $V_{OUT}$ may remain constant at reference voltage $V_{REF1}$ until the capacitance of sensor capacitor $C_X$ is altered by a touch or by an object entering its proximity. When the capacitance of sensor capacitor $C_X$ changes, the voltage at the midpoint M between $C_X$ and $C_C$ may be offset by a certain amount, causing op-amp 32 to output a voltage proportional to the change in capacitance of sensor capacitor $C_X$. The output voltage of op-amp 32 may flow through integration capacitor $C_{INT}$ and may be fed back through the inverting input (−) of op-amp 32 until the voltage at the inverting input (−) of op-amp 32 is re-balanced at reference voltage $V_{REF1}$. Accordingly, output voltage $V_{OUT}$ may rise by an amount proportional to the change in capacitance of sensor capacitor $C_X$, as represented by the following expression:

$$V_{OUT} \propto V_{DD}\left(\frac{\Delta C_X}{C_{INT}}\right)$$

Figure 4B:
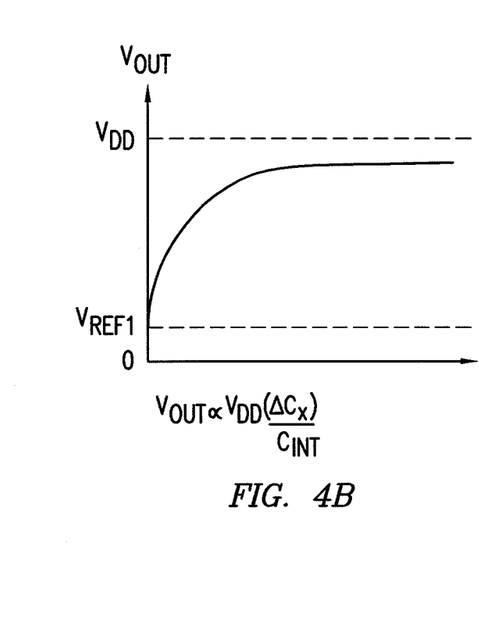
FIG. 4B illustrates a graph of an example output of the mutual-capacitance measurement circuit from FIG. 4A.

This is illustrated by the graph of FIG. 4B, which shows output voltage $V_{OUT}$ rising from $V_{REF1}$ by an amount proportional to the change in $C_X$. The first ADC measurement (i.e., $ADC_1$ from equation 40 of FIG. 2) may now be obtained from ADC 34, for example, by converting output voltage $V_{OUT}$ into a corresponding digital value.

After obtaining the first ADC measurement during the first half of the differential measurement cycle, the second phase of the differential measurement calculation may be complete. Mutual-capacitance measurement circuit 20 may then be configured for either the third or fourth phase of the differential measurement calculation, depending on whether the third phase has previously been completed. If the third phase has not previously been completed, mutual-capacitance measurement circuit 20 may be configured for the third phase of the differential measurement calculation, as described, for example, with respect to FIG. 5A. If the third phase has previously been completed, then the ADC reference measurement from the second half of the differential measurement cycle (i.e., $ADC_{REF2}$ from equation 40 of FIG. 2) may have already been obtained and may be re-used. In that case, the third phase may be skipped and mutual-capacitance measurement circuit 20 may be configured for the fourth phase of the differential measurement calculation, as described, for example, with respect to FIG. 6A.

Figure 5A:
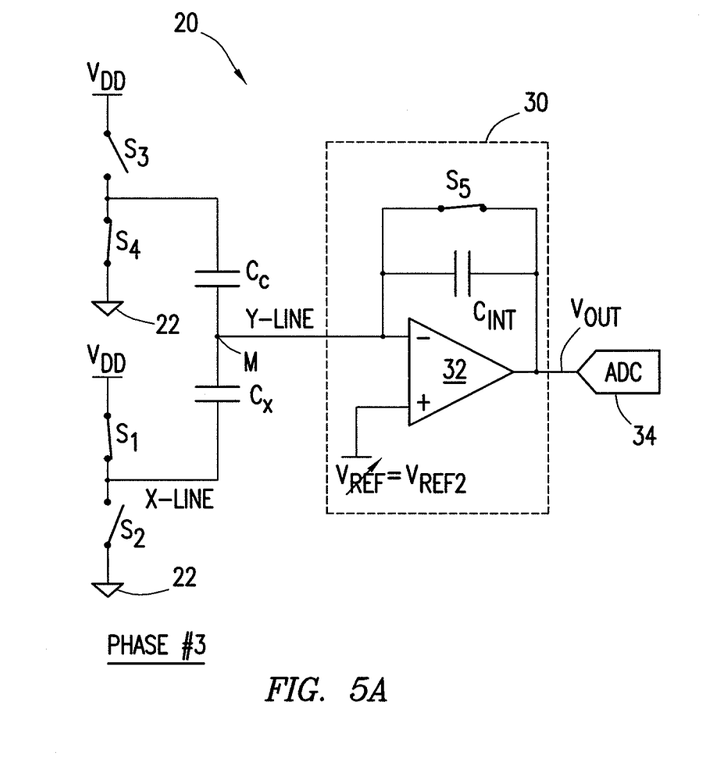
FIG. 5A illustrates an example schematic of a mutual-capacitance measurement circuit configured for the third phase of a differential measurement calculation.

FIG. 5A illustrates an example schematic of a mutual-capacitance measurement circuit 20 configured for the third phase of a differential measurement calculation. Mutual-capacitance measurement circuit 20 of FIG. 5A may be similar to mutual-capacitance measurement circuit 20 of FIG. 2 and may contain similar components. The third phase of a differential measurement calculation may involve obtaining an ADC reference measurement during the second half of a differential measurement cycle (i.e., $ADC_{REF2}$ from equation 40 of FIG. 2) while mutual-capacitance measurement circuit 20 is configured in emitter-follower mode. The third phase may be similar to the first phase except mutual-capacitance measurement circuit 20 may be configured with a reversed polarity and variable reference voltage $V_{REF}$ may be re-adjusted to an appropriate voltage for the second half of the differential measurement cycle to increase the dynamic range of the output voltage $V_{OUT}$.

As illustrated by FIG. 5A, in the third phase of a differential measurement calculation mutual-capacitance measurement circuit 20 may be configured such that the supply voltage $V_{DD}$, when applied, is driven across compensation capacitor $C_C$ and sensor capacitor $C_X$ in the opposition direction than in the first phase, causing a reversal in polarity of the charge on $C_C$ and $C_X$ and ultimately resulting in a reversal of the polarity of output voltage $V_{OUT}$. For example, mutual-capacitance measurement circuit 20 may be configured such that compensation capacitor $C_C$ may be coupled to ground 22 but not to voltage source $V_{DD}$ and sensor capacitor $C_X$ may be coupled to voltage source $V_{DD}$ but not to ground 22. In particular embodiments, compensation capacitor $C_C$ may be coupled to ground 22 but not to voltage source $V_{DD}$ by closing switch $S_4$ and opening switch $S_3$ and sensor capacitor $C_X$ may be coupled to voltage source $V_{DD}$ but not to ground 22 by closing switch $S_1$ and opening switch $S_2$. Variable reference voltage $V_{REF}$ of op-amp 32 may be adjusted to a reference voltage $V_{REF2}$ for the second half of the differential measurement cycle to increase the dynamic range of mutual-capacitance measurement circuit 20. For example, in the second half of the differential measurement cycle, reference voltage $V_{REF2}$ may be greater than half the voltage of voltage source $V_{DD}$ (i.e., more than $V_{DD}/2$), but far enough below the voltage of voltage source $V_{DD}$ to avoid low level noise. In this manner, the dynamic range of output voltage $V_{OUT}$ of mutual-capacitance measurement circuit 20 may range from $V_{REF2}$ to zero. Mutual-capacitance measurement circuit 20 may also be configured in emitter-follower mode, which, when voltage is supplied, causes output voltage $V_{OUT}$ to remain at a constant voltage equal to the non-inverting input (+) of op-amp 32. For example, mutual-capacitance measurement circuit 20 may be configured in emitter-follower mode by discharging integration capacitor $C_{INT}$. In particular embodiments, integration capacitor $C_{INT}$ may be discharged by closing switch $S_5$.

Figure 5B:
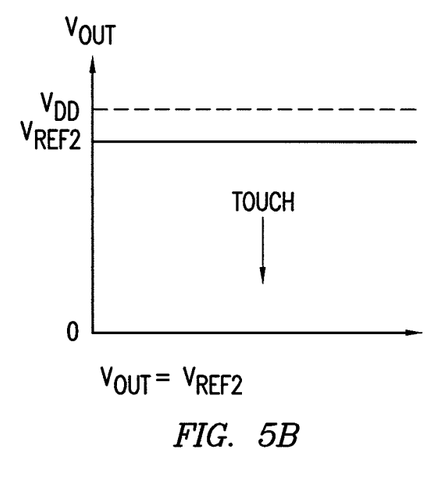
FIG. 5B illustrates a graph of an example output of the mutual-capacitance measurement circuit from FIG. 5A.

After mutual-capacitance measurement circuit 20 is configured for the third phase of the differential measurement calculation, voltage source $V_{DD}$ may be driven from the lower plate of sensor capacitor $C_X$ across compensation capacitor $C_C$, resulting in a charge share between $C_X$ and $C_C$ and a voltage at the midpoint M between $C_X$ and $C_C$ that is proportional to the values of $C_X$ and $C_C$. Because mutual-capacitance measurement circuit 20 is configured in emitter-follower mode, output voltage $V_{OUT}$ may remain at a constant voltage equal to $V_{REF2}$, which is the voltage supplied at the non-inverting input (+) of op-amp 32. This is illustrated by the graph of FIG. 5B, which shows output voltage $V_{OUT}$ remaining constant at $V_{REF2}$. The second ADC reference measurement (i.e., $ADC_{REF2}$ from equation 40 of FIG. 2) may now be obtained from ADC 34, for example, by converting output voltage $V_{OUT}$ into a corresponding digital value.

After obtaining the second ADC reference measurement during the second half of the differential measurement cycle, the third phase of the differential measurement calculation may be complete. Mutual-capacitance measurement circuit 20 may then be configured for the fourth phase of the differential measurement calculation, as described, for example, with respect to FIG. 4A.

Figure 6A:
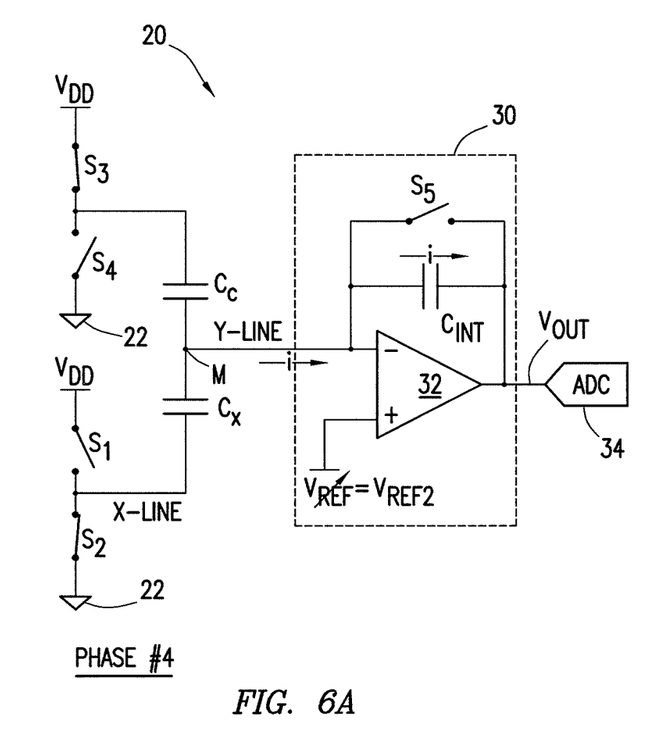
FIG. 6A illustrates an example schematic of a mutual-capacitance measurement circuit configured for the fourth phase of a differential measurement calculation.

FIG. 6A illustrates an example schematic of a mutual-capacitance measurement circuit 20 configured for the fourth phase of a differential measurement calculation. Mutual-capacitance measurement circuit 20 of FIG. 6A may be similar to mutual-capacitance measurement circuit 20 of FIG. 2 and may contain similar components. The fourth phase of a differential measurement calculation may involve calibrating a compensation capacitor $C_C$, if necessary, and obtaining an ADC measurement during the second half of a differential measurement cycle (i.e., $ADC_2$ from equation 40 of FIG. 2) while mutual-capacitance measurement circuit 20 is configured in integration mode. The fourth phase may be similar to the second phase except mutual-capacitance measurement circuit 20 may be configured with a revered polarity and variable reference voltage $V_{REF}$ may be adjusted to the same value used in the third phase.

As illustrated by FIG. 6A, in the fourth phase of a differential measurement calculation mutual-capacitance measurement circuit 20 may be configured such that the supply voltage $V_{DD}$, when applied, is driven from the top plate of compensation capacitor $C_C$ across sensor capacitor $C_X$. For example, mutual-capacitance measurement circuit 20 may be configured such that compensation capacitor $C_C$ may be coupled to voltage source $V_{DD}$ but not to ground 22 and sensor capacitor $C_X$ may be coupled to ground 22 but not to voltage source $V_{DD}$. In particular embodiments, compensation capacitor $C_C$ may be coupled to voltage source $V_{DD}$ and not ground 22 by closing switch $S_3$ and opening switch $S_4$ and sensor capacitor $C_X$ may be coupled to ground 22 but not to voltage source $V_{DD}$ by closing switch $S_2$ and opening switch $S_1$. Variable reference voltage $V_{REF}$ of op-amp 32 may also be adjusted to the same reference voltage $V_{REF2}$ as used in the third phase to increase the dynamic range of mutual-capacitance measurement circuit 20. In addition, compensation capacitor $C_C$ may be tuned to a previously calibrated value, if available. If compensation capacitor $C_C$ has not previously been calibrated for the fourth phase of the differential measurement calculation, then it may need be calibrated as explained below. Mutual-capacitance measurement circuit 20 may then be configured in integration mode, which, when voltage is supplied, causes output voltage $V_{OUT}$ to respond to changes in the input voltage of integrator circuit 30 over time. Integration mode may be configured, for example, by opening switch $S_5$ to enable integration capacitor $C_{INT}$. If mutual-capacitance measurement circuit 20 was already configured in integration mode during the previous phase, integration capacitor $C_{INT}$ may need to be discharged, for example by closing switch $S_5$, to release any charge that may remain on integration capacitor $C_{INT}$. Integration mode may then be re-configured by opening switch $S_5$ to enable integration capacitor $C_{INT}$.

After mutual-capacitance measurement circuit 20 is configured for the fourth phase of the differential measurement calculation, voltage source $V_{DD}$ may be driven from the top plate of compensation capacitor $C_C$ across sensor capacitor $C_X$, resulting in a charge share between $C_X$ and $C_C$ and a voltage at the midpoint M between $C_X$ and $C_C$ that is proportional to the values of $C_X$ and $C_C$. If compensation capacitor $C_C$ has not already been calibrated for the fourth phase, at this time compensation capacitor $C_C$ may be adjusted until mutual-capacitance measurement circuit 20 is balanced and the midpoint M between $C_C$ and $C_X$ is equal to reference voltage $V_{REF2}$. Once compensation capacitor $C_C$ has been calibrated, output voltage $V_{OUT}$ may remain constant at reference voltage $V_{REF2}$ until the capacitance of sensor capacitor $C_X$ is altered by a touch or by an object entering its proximity. When the capacitance of sensor capacitor $C_X$ changes, the voltage at the midpoint M between $C_X$ and $C_C$ may be offset by a certain amount, causing op-amp 32 to output a voltage proportional to the change in capacitance of sensor capacitor $C_X$. The output voltage of op-amp 32 may flow through integration capacitor $C_{INT}$ and may be fed back through the inverting input (−) of op-amp 32 until the voltage at the inverting input (−) of op-amp 32 is re-balanced at reference voltage $V_{REF2}$. Accordingly, output voltage $V_{OUT}$ may decrease by an amount proportional to the change in capacitance of sensor capacitor $C_X$, as represented by the following expression:

$$V_{OUT} \propto V_{DD}\left(\frac{\Delta C_X}{C_{INT}}\right)$$

Figure 6B:
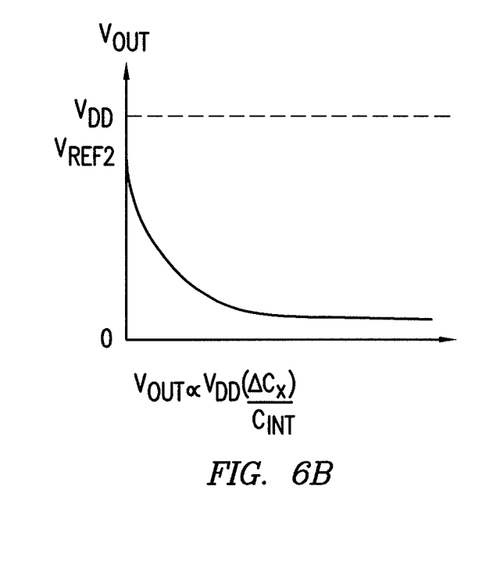
FIG. 6B illustrates a graph of an example output of the mutual-capacitance measurement circuit from FIG. 6A.

This is illustrated by the graph of FIG. 6B, which shows output voltage $V_{OUT}$ decreasing from $V_{REF2}$ by an amount proportional to the change in $C_X$. The second ADC measurement (i.e., $ADC_2$ from equation 40 of FIG. 2) may now be obtained from ADC 34, for example, by converting output voltage $V_{OUT}$ into a corresponding digital value.

After obtaining the second ADC measurement during the second half of the differential measurement cycle, the fourth phase of the differential measurement calculation may be complete. Once the fourth phase is complete, a differential measurement may then be calculated as described above with respect to equation 40 of FIG. 2, using the ADC measurements obtained from the first, second, third, and fourth phases. The differential measurement may be calculated, for example, by a touch-sensor controller such as touch-sensor controller 12 from FIG. 1. The touch-sensor controller may then use the differential measurement to determine whether a touch or proximity event occurred based on the measured change in capacitance. For subsequent differential measurements, the ADC reference measurements obtained during the first and third phases (i.e., $ADC_{REF1}$ and $ADC_{REF2}$ from equation 40 of FIG. 2) may be re-used, allowing subsequent differential measurements to be calculated by repeating the second and fourth phases but without having to repeat the first and third phases. The touch-sensor controller may continuously calculate differential measurements in this manner in order to continuously detect touch and proximity events.

Figure 7:
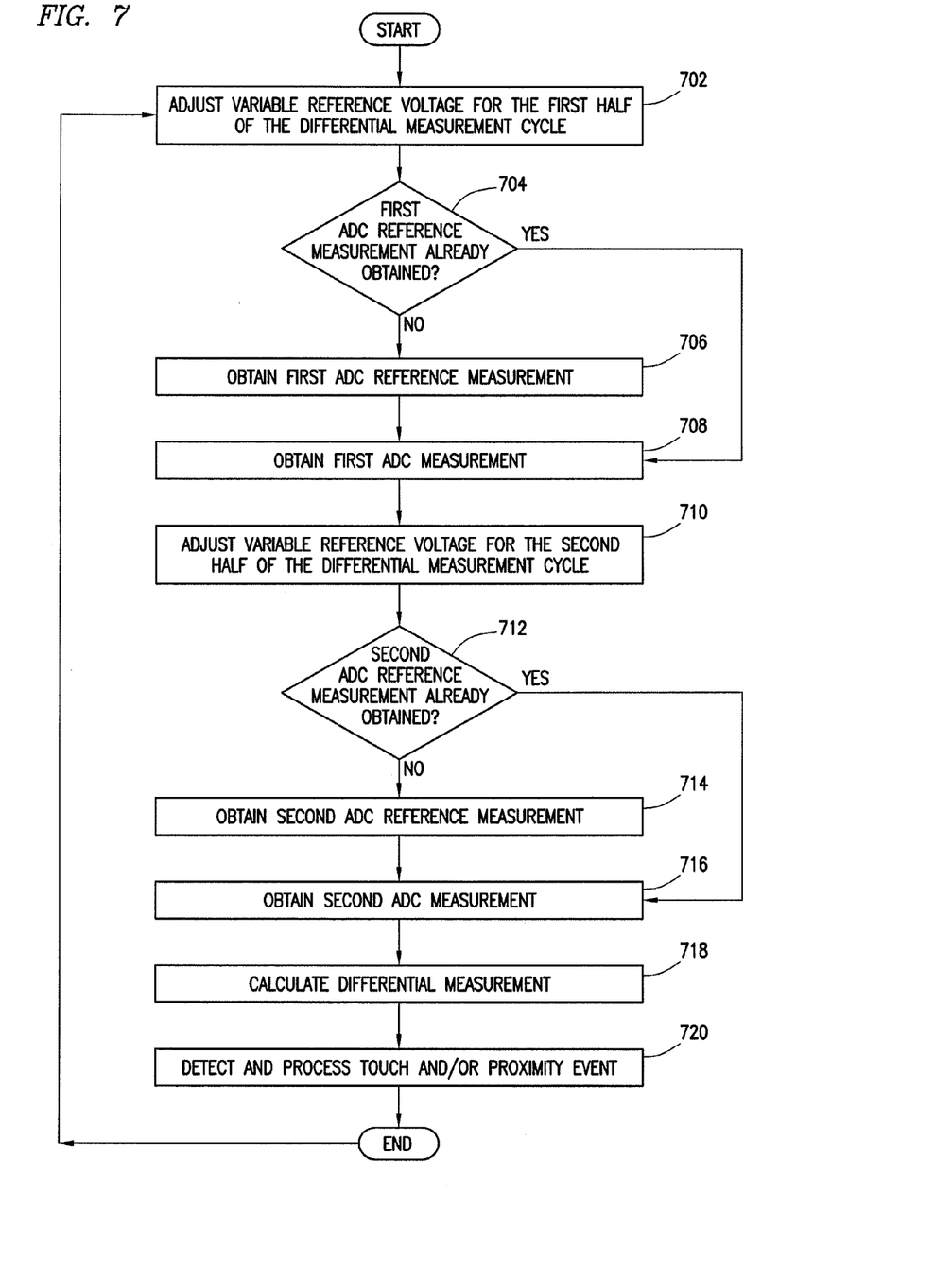
FIG. 7 illustrates an example method for detecting touch and/or proximity events using a mutual-capacitance measurement circuit with a variable reference voltage input.

FIG. 7 illustrates an example method 700 for detecting touch and/or proximity events using a mutual-capacitance measurement circuit. Method 700 may be implemented, for example, by touch sensors 10 and/or touch-sensor controllers 12 from FIGS. 1 and 2 to allow the detection of touch and/or proximity events by measuring a change in capacitance of a sensor capacitor associated with the mutual-capacitance measurement circuit. Particular embodiments of the mutual-capacitance measurement circuit may include a sensor capacitor, a compensation capacitor, and an integrator with a variable reference voltage input that may be dynamically adjusted to increase the dynamic range of the mutual-capacitance measurement circuit. In addition, in particular embodiments, the change in capacitance of the sensor capacitor may be determined using differential measurements. A differential measurement may involve two measurements of the change in capacitance of the sensor capacitor with the polarity reversed for each measurement.

The method may start at step 702, where the variable reference voltage input may be adjusted to increase the dynamic range of the mutual-capacitance measurement circuit for the first half of a differential measurement cycle. For example, in the first half of the differential measurement cycle, the variable reference voltage input may be adjusted to less than half of the supply voltage of the mutual-capacitance measurement circuit, but far enough above zero to avoid low level noise. In this manner, the output voltage of the mutual-capacitance measurement circuit may range from the variable reference voltage input to the supply voltage. After adjusting the variable reference voltage input, the method may proceed to step 704, where it may be determined whether an ADC reference measurement has already been obtained for the first half of the differential measurement cycle. If the first ADC reference measurement has already been obtained, it may be re-used and the method may proceed to step 708. If the first ADC reference measurement has not already been obtained, the method may proceed to step 706 to obtain the first ADC reference measurement. The first ADC reference measurement may be obtained at step 706, for example, by configuring the mutual-capacitance measurement circuit in emitter-follower mode. In addition, the mutual-capacitance measurement circuit may also be configured with the appropriate voltage configuration for obtaining the first ADC reference measurement. After configuring the mutual-capacitance measurement circuit in this manner, a supply voltage may be applied to the mutual-capacitance measurement circuit. Because the mutual-capacitance measurement circuit is configured in emitter-follower mode, the output voltage may remain at a constant voltage equal to variable reference voltage input. The ADC reference measurement for the first half of the differential measurement cycle may now be obtained, for example, by converting the output voltage of the mutual-capacitance measurement circuit into a corresponding digital value using an analog-to-digital converter (ADC). After obtaining the first ADC reference measurement, the method may proceed step 708.

At step 708, the ADC measurement for the first half of the differential measurement cycle may be obtained. This step may involve configuring the mutual-capacitance measurement circuit for integration mode by activating the integrator of the mutual-capacitance measurement circuit. Integration mode may cause the output voltage of the mutual-capacitance measurement circuit to respond to changes in the input voltage of the integrator over time. If the mutual-capacitance measurement circuit was already configured for integration mode, it may be necessary to discharge the integration capacitor of the integrator to release any remaining charge on the integration capacitor. After configuring integration mode, the compensation capacitor may then be tuned to a previously calibrated value for the first half of the differential measurement cycle, if available. If the compensation capacitor has not yet been calibrated for the first half of the differential measurement cycle, the compensation capacitor may need to be calibrated in the manner described below. The mutual-capacitance measurement circuit may also be configured with the appropriate voltage configuration for obtaining the ADC measurement for the first half of the differential measurement cycle. After configuring the mutual-capacitance measurement circuit in this manner, the supply voltage may be applied. If the compensation capacitor has not already been calibrated for this half of the differential measurement cycle, it may be calibrated by adjusting it until the mutual-capacitance measurement circuit is balanced and the midpoint between the compensation capacitor and the sensor capacitor is equal to the variable reference voltage input. At this point, the output voltage of the mutual-capacitance measurement circuit may remain constant at the variable reference voltage input until the capacitance of the sensor capacitor is altered by a touch or by an object entering its proximity. Because the mutual-capacitance measurement circuit is configured in integration mode, it may output a voltage proportional to the change in capacitance of the sensor capacitor. The ADC measurement for the first half of the differential measurement cycle may now be obtained, for example, by converting the output voltage into a corresponding digital value using the analog-to-digital converter. At this point, the first half of the differential measurement cycle may be complete, and the method may proceed to step 710 where the second half of the differential measurement cycle may begin.

At step 710 the variable reference voltage input may be adjusted to increase the dynamic range of the mutual-capacitance measurement circuit for the second half of the differential measurement cycle. For example, the variable reference voltage input may be adjusted to a value over half of the supply voltage of the mutual-capacitance measurement circuit, but far enough below the supply voltage to avoid low level noise. In this manner, the dynamic range of the output voltage may range from the variable reference voltage input to zero. After adjusting the variable reference voltage input, the method may proceed to step 712, where it may be determined whether an ADC reference measurement has already been obtained for the second half of the differential measurement cycle. If an ADC reference measurement has already been obtained for the second half of the differential measurement cycle, it may be re-used and the method may proceed to step 716. If the ADC reference measurement has not already been obtained for the second half of the differential measurement cycle, the method may proceed to step 714 to obtain the second ADC reference measurement. Obtaining the second ADC reference at step 714 may involve, for example, configuring the mutual-capacitance measurement circuit in emitter-follower mode. In addition, the mutual-capacitance measurement circuit may also be configured with the appropriate voltage configuration for obtaining the second ADC reference measurement. After configuring the mutual-capacitance measurement circuit in this manner, a supply voltage may be applied. Because the mutual-capacitance measurement circuit is configured in emitter-follower mode, the output voltage may remain at a constant voltage equal to variable reference voltage input. The ADC reference measurement for the second half of the differential measurement cycle may now be obtained, for example, by converting the output voltage into a corresponding digital value using the analog-to-digital converter. After obtaining the second ADC reference measurement, the method may proceed to step 716.

At step 716, the ADC measurement for the second half of the differential measurement cycle may be obtained. This step may first involve configuring the mutual-capacitance measurement circuit for integration mode. If the mutual-capacitance measurement circuit was already configured for integration mode, it may be necessary to discharge the integration capacitor of the integrator to release any remaining charge on the integration capacitor. After configuring integration mode, the compensation capacitor may then be tuned to a previously calibrated value for the second half of the differential measurement cycle, if available. If the compensation capacitor has not yet been calibrated for the second half of the differential measurement cycle, the compensation capacitor may need to be calibrated in the manner described below. The mutual-capacitance measurement circuit may also be configured with the appropriate voltage configuration for obtaining the ADC measurement for the second half of the differential measurement cycle. After configuring the mutual-capacitance measurement circuit in this manner, the supply voltage may be applied. If the compensation capacitor has not already been calibrated for this half of the differential measurement cycle, it may be calibrated by adjusting it until the mutual-capacitance measurement circuit is balanced and the midpoint between the compensation capacitor and the sensor capacitor is equal to the variable reference voltage input. At this point, the output voltage of the mutual-capacitance measurement circuit may remain constant at the variable reference voltage input until the capacitance of the sensor capacitor is altered by a touch or by an object entering its proximity. Because the mutual-capacitance measurement circuit is configured in integration mode, it may output a voltage proportional to the change in capacitance of the sensor capacitor. The ADC measurement for the second half of the differential measurement cycle may now be obtained, for example, by converting the output voltage into a corresponding digital value using the analog-to-digital converter. At this point, the second half of the differential measurement cycle may be complete.

The method may then proceed to step 718 where a differential measurement may be calculated, for example, as described above with respect to equation 40 of FIG. 2. After calculating the differential measurement, at step 720 the differential measurement may be used to determine whether a touch or proximity event occurred, and if so, the event may be processed in the appropriate manner. At this point, the method may be complete. In particular embodiments, the method may restart at step 702 in order to begin obtaining the necessary measurements for calculating a new differential measurement. Method 700 may be implemented to continuously calculate differential measurements in this manner to detect touch and/or proximity events.

Particular embodiments may repeat the steps of the method of FIG. 7, where appropriate. Moreover, although this disclosure describes and illustrates particular steps of the method of FIG. 7 as occurring in a particular order, this disclosure contemplates any suitable steps of the method of FIG. 7 occurring in any suitable order. Furthermore, although this disclosure describes and illustrates particular components, devices, or systems carrying out particular steps of the method of FIG. 7, this disclosure contemplates any suitable combination of any suitable components, devices, or systems carrying out any suitable steps of the method of FIG. 7.

Herein, reference to a computer-readable non-transitory storage medium or media may include one or more semiconductor-based or other integrated circuits (ICs) (such, as for example, a field-programmable gate array (FPGA) or an application-specific IC (ASIC)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards, SECURE DIGITAL drives, any other suitable computer-readable non-transitory storage medium or media, or any suitable combination of two or more of these, where appropriate. A computer-readable non-transitory storage medium or media may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method of detecting a change in capacitance, comprising:
    adjusting a variable reference voltage input of an integrator of a mutual-capacitive measurement circuit to a first reference voltage, wherein the first reference voltage is selected to increase a range of voltages that can be output by the mutual-capacitive measurement circuit during a first half of a differential measurement cycle;
    configuring the mutual-capacitive measurement circuit for obtaining a first reference measurement during the first half of the differential measurement cycle;
    obtaining the first reference measurement from an analog-digital-converter coupled to an output of the mutual-capacitance measurement circuit;
    configuring the mutual-capacitive measurement circuit for obtaining a first output measurement during the first half of the differential measurement cycle;
    obtaining the first output measurement from the analog-digital-converter;
    adjusting the variable reference voltage input to a second reference voltage, wherein the second reference voltage is selected to increase the range of voltages that can be output by the mutual-capacitive measurement circuit during a second half of the differential measurement cycle;
    configuring the mutual-capacitive measurement circuit for obtaining a second reference measurement during the second half of the differential measurement cycle;
    obtaining the second reference measurement from the analog-digital-converter;
    configuring the mutual-capacitive measurement circuit for obtaining a second output measurement during the second half of the differential measurement cycle;
    obtaining the second output measurement from the analog-digital-converter; and
    determining whether a touch or proximity event relative to a touch sensitive device has occurred based on calculating a differential measurement using a difference between the first reference measurement and the first output measurement and a difference between the second reference measurement and the second output measurement.

2. The method of claim 1, wherein configuring the mutual-capacitive measurement circuit for obtaining a first reference measurement during the first half of the differential measurement cycle comprises:
    deactivating the integrator of the mutual-capacitive measurement circuit;
    configuring the mutual-capacitive measurement circuit according to a voltage configuration for obtaining the first reference measurement; and
    applying a supply voltage to the mutual-capacitive measurement circuit.

3. The method of claim 1, wherein configuring the mutual-capacitive measurement circuit for obtaining a first output measurement during the first half of the differential measurement cycle comprises:
    activating the integrator of the mutual-capacitive measurement circuit;
    configuring the mutual-capacitive measurement circuit according to a voltage configuration for obtaining the first output measurement; and
    applying a supply voltage to the mutual-capacitive measurement circuit.

4. The method of claim 3, wherein configuring the mutual-capacitive measurement circuit for obtaining a first output measurement during the first half of the differential measurement cycle further comprises calibrating a compensation capacitor of the mutual-capacitive measurement circuit.

5. The method of claim 1, wherein configuring the mutual-capacitive measurement circuit for obtaining a second reference measurement during the second half of the differential measurement cycle comprises:
    deactivating the integrator of the mutual-capacitive measurement circuit;
    configuring the mutual-capacitive measurement circuit according to a voltage configuration for obtaining the second reference measurement; and
    applying a supply voltage to the mutual-capacitive measurement circuit.

6. The method of claim 1, wherein configuring the mutual-capacitive measurement circuit for obtaining a second output measurement during the second half of the differential measurement cycle comprises:
    activating the integrator of the mutual-capacitive measurement circuit;
    configuring the mutual-capacitive measurement circuit according to a voltage configuration for obtaining the second output measurement; and
    applying a supply voltage to the mutual-capacitive measurement circuit.

7. The method of claim 6, wherein configuring the mutual-capacitive measurement circuit for obtaining a second output measurement during the second half of the differential measurement cycle further comprises calibrating a compensation capacitor of the mutual-capacitive measurement circuit.

8. The method of claim 1, further comprising detecting a proximity of an object relative to the touch sensitive device based on the differential measurement.

9. An apparatus comprising:
    a mutual-capacitive measurement circuit comprising:
        a mutual-capacitive sensor comprising a sensor capacitor and a compensation capacitor;
        an integrator coupled to the mutual-capacitive sensor, the integrator having a variable reference voltage input capable of being adjusted to increase a range of voltages that can be output by the mutual-capacitive measurement circuit;

an analog-to-digital converter coupled to an output of the mutual-capacitive measurement circuit; and a controller operable to:
dynamically adjust, over a plurality of measurement phases, the variable reference voltage input of the integrator; and
adjust the compensation capacitor until a voltage representing a charge share between the sensor capacitor and the compensation capacitor is equal to a particular reference voltage to which the variable reference voltage input is dynamically adjusted.

10. The apparatus of claim 9, wherein the mutual-capacitive measurement circuit is embodied in a touch sensitive device.

11. The apparatus of claim 10, wherein the controller is further operable to:
deactivate the integrator of the mutual-capacitive measurement circuit;
configure the mutual-capacitive measurement circuit according to a first voltage configuration, wherein the first voltage configuration results in a charge on the sensor capacitor and the compensation capacitor when a supply voltage is applied to the mutual-capacitive measurement circuit;
adjust the variable reference voltage input of the integrator to a first reference voltage, wherein the first reference voltage is selected to increase the range of voltages that can be output by the mutual-capacitive measurement circuit;
apply the supply voltage to the mutual-capacitive measurement circuit; and
obtain a first reference measurement from the analog-digital-converter.

12. The apparatus of claim 11, wherein the controller is further operable to:
activate the integrator of the mutual-capacitive measurement circuit;
configure the mutual-capacitive measurement circuit according to a second voltage configuration, wherein the second voltage configuration results in a reversed polarity of the charge resulting from the first voltage configuration;
adjust the variable reference voltage input to the first reference voltage;
apply the supply voltage to the mutual-capacitive measurement circuit; and
obtain a first output measurement from the analog-digital-converter.

13. The apparatus of claim 12, wherein the controller is further operable to:
deactivate the integrator of the mutual-capacitive measurement circuit;
configure the mutual-capacitive measurement circuit according to the second voltage configuration;
adjust the variable reference voltage input to a second reference voltage, wherein the second reference voltage is selected to increase the range of voltages that can be output by the mutual-capacitive measurement circuit;
apply the supply voltage to the mutual-capacitive measurement circuit; and
obtain a second reference measurement from the analog-digital-converter.

14. The apparatus of claim 13, wherein the controller is further operable to:
activate the integrator of the mutual-capacitive measurement circuit;
configure the mutual-capacitive measurement circuit according to the first voltage configuration;
adjust the variable reference voltage input to the second reference voltage;
apply the supply voltage to the mutual-capacitive measurement circuit; and
obtain a second output measurement from the analog-digital-converter.

15. The apparatus of claim 14, wherein the controller is further operable to:
calculate a differential measurement using the first reference measurement, the first output measurement, the second reference measurement, and the second output measurement; and
detect a proximity of an object relative to the touch sensitive device based on the differential measurement.

16. A method of detecting a change in capacitance, comprising:
deactivating an integrator of a mutual-capacitive measurement circuit;
configuring the mutual-capacitive measurement circuit according to a first voltage configuration, wherein the first voltage configuration results in a charge on a sensor capacitor and a compensation capacitor when a supply voltage is applied to the mutual-capacitive measurement circuit;
adjusting a variable reference voltage input of the integrator to a first reference voltage, wherein the first reference voltage is selected to increase a range of voltages that can be output by the mutual-capacitive measurement circuit;
applying the supply voltage to the mutual-capacitive measurement circuit;
obtaining a first reference measurement from an analog-digital-converter coupled to an output of the mutual-capacitance measurement circuit, wherein the first reference measurement represents an output voltage equal to a voltage between the sensor capacitor and the compensation capacitor when the mutual-capacitive measurement circuit is balanced; and
determining whether a touch or proximity event has occurred based on calculating a differential measurement at least in part by using a difference between the first reference measurement and an output measurement.

17. The method of claim 16, further comprising:
activating the integrator of the mutual-capacitive measurement circuit;
configuring the mutual-capacitive measurement circuit according to a second voltage configuration, wherein the second voltage configuration results in a reversed polarity of the charge resulting from the first voltage configuration;
adjusting the variable reference voltage input to the first reference voltage;
applying the supply voltage to the mutual-capacitive measurement circuit; and
obtaining a first output measurement from the analog-digital-converter.

18. The method of claim 17, further comprising:
deactivating the integrator of the mutual-capacitive measurement circuit;
configuring the mutual-capacitive measurement circuit according to the second voltage configuration;
adjusting the variable reference voltage input to a second reference voltage, wherein the second reference voltage is selected to increase the range of voltages that can be output by the mutual-capacitive measurement circuit;

applying the supply voltage to the mutual-capacitive measurement circuit; and obtaining a second reference measurement from the analog-digital-converter.

19. The method of claim 18, further comprising:

activating the integrator of the mutual-capacitive measurement circuit;

configuring the mutual-capacitive measurement circuit according to the first voltage configuration;

adjusting the variable reference voltage input to the second reference voltage;

applying the supply voltage to the mutual-capacitive measurement circuit; and obtaining a second output measurement from the analog-digital-converter.

20. The method of claim 19, further comprising:

calculating the differential measurement using the first reference measurement, the first output measurement, the second reference measurement, and the second output measurement; and detecting a proximity of an object relative to a touch sensitive device based on the differential measurement.

* * * * *